United States Patent
Weng et al.

(10) Patent No.: US 10,930,892 B1
(45) Date of Patent: Feb. 23, 2021

(54) OLED DISPLAY PANEL HAVING PHASE-COMPENSATED LIQUID CRYSTAL LAYER AND MANUFACTURING METHOD THEREOF

(71) Applicant: Wuhan China Star Optoelectronics Semiconductor Display Technology Co., Ltd., Wuhan (CN)

(72) Inventors: Dezhi Weng, Wuhan (CN); Gaozhen Wang, Wuhan (CN); Kai Ma, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/794,304

(22) Filed: Feb. 19, 2020

(30) Foreign Application Priority Data

Dec. 25, 2019 (CN) .......................... 201911360616.9

(51) Int. Cl.
| | | |
|---|---|---|
| *H01L 29/08* | (2006.01) | |
| *H01L 51/52* | (2006.01) | |
| *H01L 27/32* | (2006.01) | |
| *G02B 5/30* | (2006.01) | |
| *H01L 51/56* | (2006.01) | |

(52) U.S. Cl.
CPC ........ *H01L 51/5281* (2013.01); *G02B 5/3025* (2013.01); *H01L 27/3232* (2013.01); *H01L 51/56* (2013.01)

(58) Field of Classification Search
CPC . H01L 51/5281; H01L 51/56; H01L 27/3232; G02B 5/3025

USPC ........................................................ 257/40
See application file for complete search history.

(56) References Cited

U.S. PATENT DOCUMENTS

| | | | |
|---|---|---|---|
| 9,411,168 B2* | 8/2016 | Wang ................... | G02B 5/3083 |
| 9,899,001 B2* | 2/2018 | Wang ................... | H01L 27/3211 |
| 2003/0127656 A1* | 7/2003 | Aizawa ............... | H01L 51/5281 |
| | | | 257/79 |
| 2005/0062903 A1* | 3/2005 | Cok ........................ | H01S 5/423 |
| | | | 349/69 |
| 2017/0125743 A1* | 5/2017 | Kim ..................... | H01L 27/3244 |
| 2018/0006274 A1* | 1/2018 | Kim ..................... | H01L 27/3246 |
| 2018/0122874 A1* | 5/2018 | Kim ..................... | H01L 27/3213 |
| 2020/0013838 A1* | 1/2020 | Takechi .............. | H01L 27/3248 |

* cited by examiner

*Primary Examiner* — Caleb E Henry
(74) *Attorney, Agent, or Firm* — Nathan & Associates; Nathan Menachem

(57) ABSTRACT

An organic light-emitting diode (OLED) display panel and a method of manufacturing the same are disclosed. The OLED display panel includes a phase-compensated liquid crystal layer and a linear polarizer disposed on an organic light-emitting device layer. The phase-compensated liquid crystal layer is disposed between the organic light-emitting device layer and the linear polarizer. Polarized light is generated after external light passes through a linear polarizer and the phase-compensated liquid crystal layer and is reflected to go through again the phase-compensated liquid crystal layer in a direction perpendicular to a polarization direction of the linear polarizer. By providing a liquid crystal layer to achieve compensation for phase difference, the present application can overcome a problem of visual interference and glare effects brought about by the display panel due to external light.

14 Claims, 4 Drawing Sheets

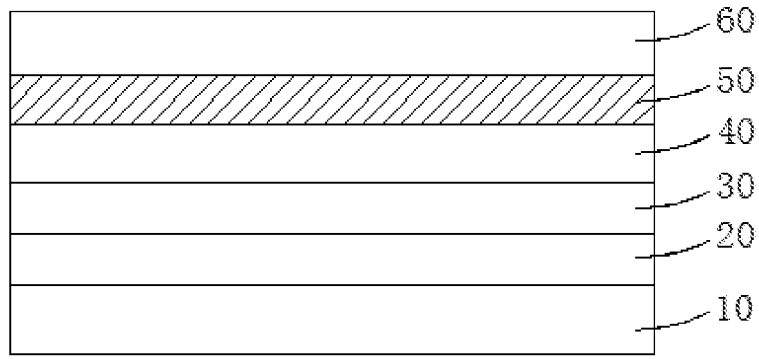

FIG. 4 providing a display substrate to be prepared with a phase-compensated liquid crystal layer, and forming, by performing linearly polarizing ultraviolet light irradiation on a surface of the display substrate, an alignment groove on the surface of the display substrate — S1 preparing a liquid crystal material on the surface of the display substrate, wherein liquid crystal molecules in the liquid crystal material are twisted at predetermined angles and neatly arranged with respect to the alignment groove, and forming, by curing the liquid crystal material, the phase-compensated liquid crystal layer — S2 laminating a linear polarizer on the phase-compensated liquid crystal layer to enable generation of polarized light such that after external light passes through the linear polarizer and the phase-compensated liquid crystal layer, the external light is reflected to go through again the phase compensation liquid crystal layer in a direction perpendicular to a polarization direction of the linear polarizer — S3

FIG. 5

OLED DISPLAY PANEL HAVING PHASE-COMPENSATED LIQUID CRYSTAL LAYER AND MANUFACTURING METHOD THEREOF

BACKGROUND OF INVENTION

1. Field of Invention

The present invention relates to a technical field of displays, and particularly to, an organic light-emitting diode (OLED) display panel and a method of manufacturing the same.

2. Related Art

With rapid development of display panel industries, organic light-emitting diodes (OLEDs) have gradually replaced liquid crystal displays (LCDs) due to their advantages of, such as high contrast, quick response times, wide viewing angles, and free of backlight sources, and have been regarded as the most perfect display product at present by industries. However, due to metal electrode structures, OLED displays may cause visual interference and give rise to glare effects when receiving light reflected by indoor or external strong light.

In respect of the above-mentioned problem, general solutions are to attach circular polarizers on screens, thereby to effectively resist strong light from external environments and to increase contrast of mobile phone screens. The circular polarizers are generally composed of linear polarizers and 1/4λ phase difference compensation films. On the other hand, wide-wavelength 1/4λ phase difference compensation films violating the law of nature are rare and valuable because of their unique design, and therefore keep prices of circular polarizers high. Besides, two-layered polarizers reduce light extraction efficiency of photons by about 20% to 30%.

Therefore, it is imperative to overcome problems of the prior art.

SUMMARY OF INVENTION

The present application provides an organic light-emitting diode (OLED) display panel and a method of manufacturing the same to overcome a problem of visual interference and glare effects brought about by the display panel due to external light.

In order to overcome the above-mentioned problem, the present application provides a technical solution as follows:

The present application provides an organic light-emitting diode (OLED) display panel, comprising a substrate; an array layer disposed on a surface of the substrate; an organic light-emitting device layer disposed on a surface of the array layer; a thin-film encapsulation layer disposed on the organic light-emitting device layer; and a linear polarizer and a phase-compensated liquid crystal layer, wherein the linear polarizer is disposed on a side of the organic light-emitting device layer away from the substrate, and the phase-compensated liquid crystal layer is disposed between the organic light-emitting device layer and the linear polarizer; wherein polarized light is generated after external light passes through the linear polarizer and the phase-compensated liquid crystal layer to be reflected to go through again the phase-compensated liquid crystal layer in a direction perpendicular to a polarization direction of the linear polarizer.

In the OLED display panel of the present application, the phase-compensated liquid crystal layer is disposed between the organic light-emitting device layer and the thin-film encapsulation layer.

In the OLED display panel of the present application, the thin-film encapsulation layer at least comprises a three-layered structure including a plurality of inorganic layers and at least an organic layer disposed in a stack arrangement, and the phase-compensated liquid crystal layer is disposed between any adjacent two of the inorganic layers and the organic layer.

In the OLED display panel of the present application, the phase-compensated liquid crystal layer is disposed between the thin-film encapsulation layer and the linear polarizer.

In the OLED display panel of the present application, the linear polarizer is disposed on a surface of the phase-compensated liquid crystal layer.

In the OLED display panel of the present application, the linear polarizer is spaced apart from the phase-compensated liquid crystal layer with respect to the inorganic layers and/or the organic layer.

In the OLED display panel of the present application, an alignment groove for aligning liquid crystal molecules is provided on a surface of the organic light-emitting device layer or a surface of one of the inorganic layers or the organic layer in contact with the phase-compensated liquid crystal layer.

In the OLED display panel of the present application, the phase-compensated liquid crystal layer comprises liquid crystal molecules neatly arranged and aligned in twist directions at predetermined angles so that linearly polarized light is generated after the external light passes through the linear polarizer, wherein the linearly polarized light passes through the phase-compensated liquid crystal layer to form circularly polarized light.

In the OLED display panel of the present application, the phase-compensated liquid crystal layer is configured to compensate a phase difference of a quarter wavelength.

In order to overcome the above-mentioned problem, the present application further provides a method of manufacturing an organic light-emitting diode (OLED) display panel, comprising S1: providing a display substrate to be prepared with a phase-compensated liquid crystal layer, and forming, by performing linearly polarizing ultraviolet light irradiation on a surface of the display substrate, an alignment groove on the surface of the display substrate; S2: preparing a liquid crystal material on the surface of the display substrate, wherein liquid crystal molecules in the liquid crystal material are twisted at predetermined angles and neatly arranged with respect to the alignment groove, and forming, by curing the liquid crystal material, the phase-compensated liquid crystal layer; and S3: laminating a linear polarizer on the phase-compensated liquid crystal layer to enable generation of polarized light such that after external light passes through the linear polarizer and the phase-compensated liquid crystal layer, the external light is reflected to go through again the phase-compensated liquid crystal layer in a direction perpendicular to a polarization direction of the linear polarizer.

The present application has advantageous effects as follows: based on an OLED display panel and a method of manufacturing the same, the present application introduces a 1/4λ phase-compensated liquid crystal layer on an organic light-emitting device layer to replace a traditional 1/4λ phase difference compensation film, thereby significantly reducing costs of the OLED display panel, and overcoming a problem of visual interference and glare effects brought about by the display panel due to external light.

BRIEF DESCRIPTION OF DRAWINGS

The following detailed description of specific embodiments of the present application will make the technical solutions and other beneficial effects of the present application obvious in conjunction with the accompanying drawings.

FIG. 4 is a schematic structural view of an OLED display panel in accordance with a third embodiment of the present application.

FIG. 5 is a flowchart of a method of manufacturing an OLED display panel of the present application.

DESCRIPTION OF PREFERRED EMBODIMENTS

Figure 1:
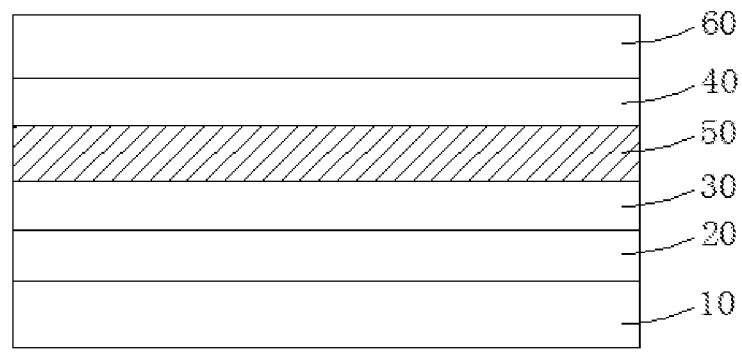
FIG. 1 is a schematic structural view of an organic light-emitting diode (OLED) display panel in accordance with a first embodiment of the present application.

The following embodiments are referring to the accompanying drawings for exemplifying specific implementable embodiments of the present application. Directional terms described by the present application, such as upper, lower, front, back, left, right, inner, outer, side, etc., are only directions by referring to the accompanying drawings. Thus the used directional terms are used to describe and understand the present application, but the present invention is not limited thereto. In the drawings, similar structural units are denoted by the same reference numerals.

The present application is aimed to overcome a technical problem of visual interference and glare effects brought about by conventional display panels due to external light.

The present application provides an organic light-emitting diode (OLED) display panel. Please refer to FIGS. 1-4. The OLED display panel includes a substrate 10, wherein the substrate 10 may be a glass substrate or a flexible substrate; an array layer 20 disposed on a surface of the substrate 10; an organic light-emitting device layer 30 disposed on a surface of the array layer 20; a thin-film encapsulation layer 40 disposed on the organic light-emitting device layer 30; and an a linear polarizer 60 and a phase-compensated liquid crystal layer 50. The linear polarizer 60 is disposed on a side of the organic light-emitting device layer 30 away from the substrate 10, and the phase-compensated liquid crystal layer 50 is disposed between the organic light-emitting device layer 30 and the linear polarizer 60.

The array layer 20 includes, but is not limited to, an inorganic laminated film layer, such as a buffer layer, a gate insulating layer, and an interlayer dielectric layer, and a thin-film transistor located in the inorganic laminated film layer.

Organic film layers (not shown) laminated together, such as a planarization layer and a pixel definition layer, are provided on the array layer 20. The pixel definition layer is patterned to form pixel holes.

The organic light-emitting device layer 30 includes an anode layer, an organic light-emitting layer, and a cathode layer all disposed in a stack arrangement. The anode layer is electrically connected to the thin-film transistor on the array layer 20 through a via hole.

The thin-film encapsulation layer 40 at least includes a three-layered structure including a plurality of inorganic layers 401 and at least an organic layer 402 disposed in a stack arrangement.

A circular polarizer usually used in a conventional display panel is generally composed of a linear polarizer and a 1/4λ phase difference compensation film, and prices of the 1/4λ phase difference compensation films are relatively expensive, making the cost of the product higher. Besides, two-layered polarizers reduce light extraction efficiency of photons by about 20% to 30%, thereby adversely affecting display performance.

In order to overcome the above-mentioned problem, the present application introduces the phase-compensated liquid crystal layer 50 with a phase difference of a quarter wavelength (1/4λ) on the organic light-emitting device layer 30 to replace a traditional 1/4λ phase difference compensation film. A position of the phase-compensated liquid crystal layer 50 in the present application may be designed in various forms, as long as it is located above the organic light-emitting device layer 30.

In the present application, external light passes through the linear polarizer 60 to form linearly polarized light. Because liquid crystal molecules of the phase-compensated liquid crystal layer 50 are aligned in twist directions at predetermined angles, a light direction of the linearly polarized light passing through the phase-compensated liquid crystal layer 50 will be changed so that circularly polarized light is produced. After being reflected, the circularly polarized light goes through again the phase-compensated liquid crystal layer 50 in a direction perpendicular to a polarization direction of the linear polarizer 60. At this time, the external light entering the display panel will not be reflected out from the linear polarizer 60, so a display screen can be prevented from dazzling due to strong external light. Because light emitted from the organic light-emitting device layer 30 is not affected by the external light, and a conventional 1/4λ phase difference compensation film is not used, light extraction efficiency of photos of the organic light-emitting device layer 30 increases by 10% to 15%, as well as brightness and contrast of the panel also increase.

The following describes the OLED display panel of the present application in detail with reference to specific embodiments.

Please refer to FIG. 1 showing a schematic structural view of an organic light-emitting diode (OLED) display panel in accordance with a first embodiment of the present application. In this embodiment, the phase-compensated liquid crystal layer 50 is disposed between the organic light-emitting device layer 30 and the thin-film encapsulation layer 40, that is, the phase-compensated liquid crystal layer 50 is disposed on a surface of the cathode layer. An alignment groove (not shown) is provided on a surface of the organic light-emitting device layer 30 (i.e. the cathode layer) in contact with the phase-compensated liquid crystal layer 50. The alignment groove is configured for aligning liquid crystal molecules in the phase-compensated liquid crystal layer 50.

The linear polarizer 60 is spaced apart from the phase-compensated liquid crystal layer 50 with respect to the thin-film encapsulation layer 40, or the linear polarizer 60 is disposed within the thin-film encapsulation layer 40 and is spaced apart from the phase-compensated liquid crystal layer 50 with respect to the inorganic layer 401 and/or the organic layer 402.

In another embodiment, the linear polarizer 60 is disposed on a surface of the phase-compensated liquid crystal layer 50, and the thin-film encapsulation layer 40 is disposed on a surface of the linear polarizer 60.

Figure 2:
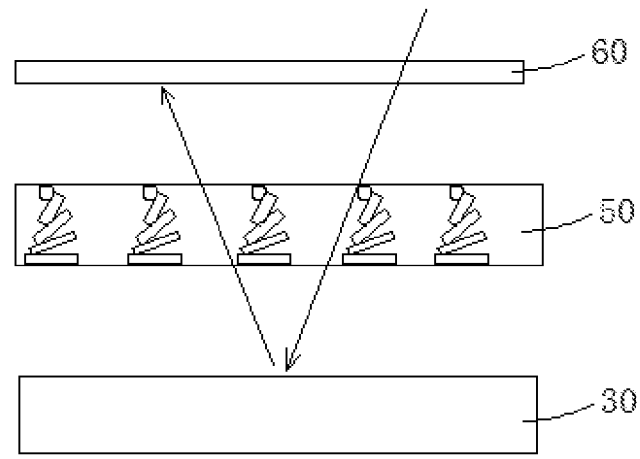
FIG. 2 is a schematic view showing working principle of a phase-compensated liquid crystal layer of the present application.

In the present embodiment, further referring to FIG. 2, the liquid crystal molecules of the phase-compensated liquid crystal layer 50 are neatly arranged in a same direction intersecting an axial direction of the linear polarizer 60 at a certain angle, to achieve a same polarization direction for all photons when passing through the liquid crystal molecules. The phase-compensated liquid crystal layer 50 is a twisted nematic (TN) type, and the liquid crystal molecules are twisted and aligned at predetermined angles, so that a polarization direction of light can be rotated in a voltage-free state.

Taking the linear polarizer 60 as a horizontal polarizer as an example, external light passes through the linear polarizer 60 and becomes horizontally polarized light, and then passes through the phase-compensated liquid crystal layer 50 and becomes right circularly polarized light. The right circularly polarized light is reflected by a metal film layer of the organic light-emitting device layer 30 and turns to left circularly polarized light. The left circularly polarized light passes through the phase-compensated liquid crystal layer 50 again and turns to vertically polarized light. At this time, the vertically polarized light is perpendicular to a polarization direction of the horizontal polarizer, and light cannot pass through the horizontal polarizer, so the display screen will not be dazzling due to strong external light. Light emitted by the organic light-emitting device layer 30 is not affected by the phase-compensated liquid crystal layer 50 and the linear polarizer 60, so the light can be emitted from the display panel normally. In addition, the use of the phase-compensated liquid crystal layer 50 can increase light extraction efficiency of photos, as well as increase brightness and contrast of the display panel.

Please refer to FIGS. 3A-3D each showing schematic structural views of a thin-film encapsulation layer of an OLED display panel in accordance with a second embodiment of the present application. A structure of the OLED display panel in this embodiment is the same as/similar to the structure of the OLED display panel in the first embodiment, except that the phase-compensated liquid crystal layer 50 is disposed between any adjacent two of the inorganic layers 401 and the organic layer 402 in the thin-film encapsulation layer 40.

The linear polarizer 60 is spaced apart from the phase-compensated liquid crystal layer 50 with respect to the inorganic layers 401 and/or the organic layer 402.

In another embodiment, the linear polarizer 60 is also disposed in the thin-film encapsulation layer 40 and located on a surface of the phase-compensated liquid crystal layer 50.

Figure 3A:
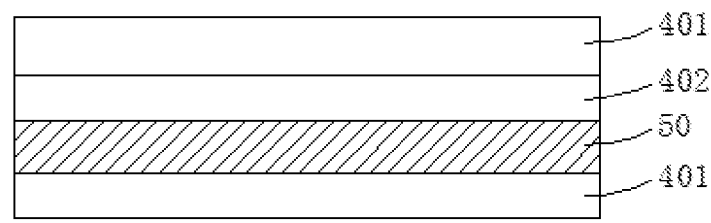
FIGS. 3A-3D are schematic structural views of a thin-film encapsulation layer of an OLED display panel in accordance with a second embodiment of the present application.
Figure 3B:
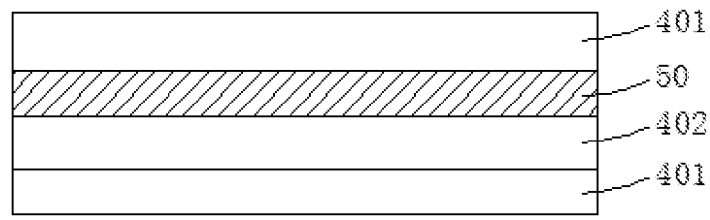
Figure 3C:
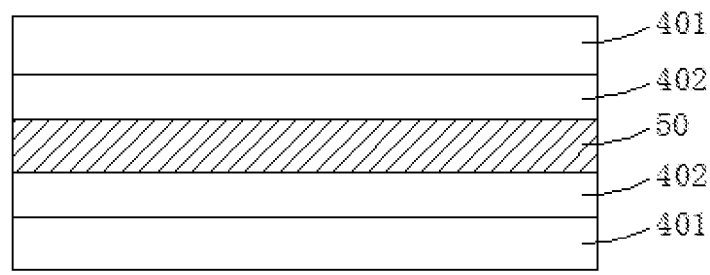
Figure 3D:
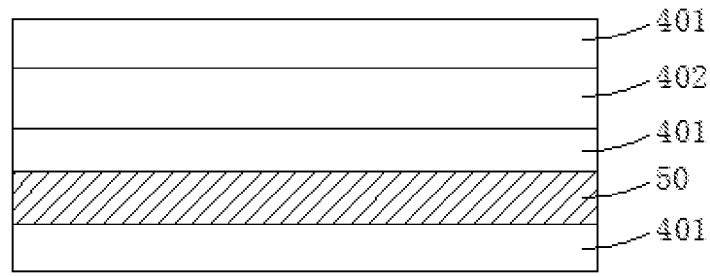
Figure 6A:
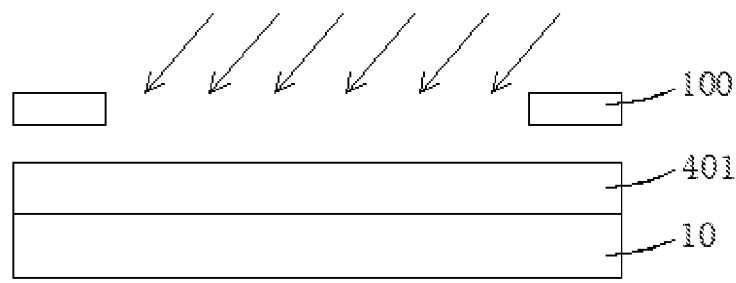
FIGS. 6A-6D are schematic views showing processes of manufacturing an OLED display panel of the present application.
Figure 6B:
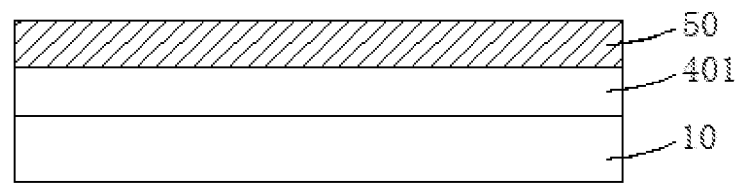
Figure 6C:
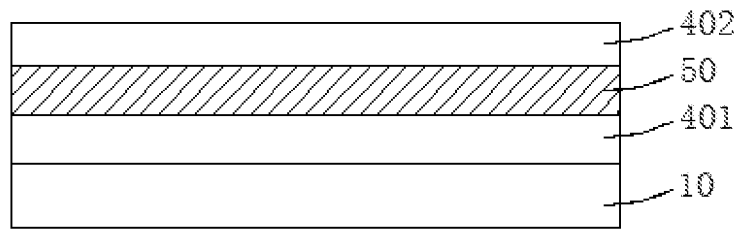
Figure 6D:
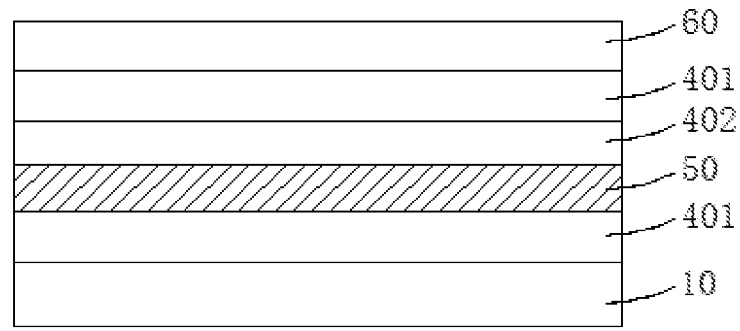

There may be various positions configured for the phase-compensated liquid crystal layer 50 in this embodiment, and the following are merely examples and are not limited thereto. As shown in FIG. 3A, the phase-compensated liquid crystal layer 50 is disposed between the first inorganic layer 401 and the organic layer 402. As shown in FIG. 3B, the phase-compensated liquid crystal layer 50 is disposed between the organic layer 402 and the second inorganic layer 401. As show in FIG. 3C, there are two organic layers 402 formed separately, and the phase-compensated liquid crystal layer 50 is disposed between the adjacent two organic layers 402. As shown in FIG. 3D, there are two inorganic layers 401 formed separately, and the phase-compensated liquid crystal layer 50 is disposed between the adjacent two inorganic layers 402.

An alignment groove for aligning liquid crystal molecules is provided on a surface of one of the inorganic layers 401 or the organic layer 402 in contact with the phase-compensated liquid crystal layer 50. A type of the phase-compensated liquid crystal layer 50 in this embodiment may be the same as that of the phase-compensated liquid crystal layer 50 in the first embodiment, but is not limited thereto.

Working principles of the phase-compensated liquid crystal layer 50 and the linear polarizer 60 in this embodiment are consistent with working principles in the first embodiment, and are not repeated here.

Please refer to FIG. 4 showing a schematic structural view of an OLED display panel in accordance with a third embodiment of the present application. A structure of the OLED display panel in this embodiment is the same as/similar to the structure of the OLED display panel of the first embodiment, except that the phase-compensated liquid crystal layer 50 is disposed on the thin-film encapsulation layer 40, and the linear polarizer 60 is disposed on a surface of the phase-compensated liquid crystal layer 50.

An alignment groove for aligning liquid crystal molecules is provided on a surface of the thin-film encapsulation layer 40 in contact with the phase-compensated liquid crystal layer 50.

Working principles of the phase-compensated liquid crystal layer 50 and the linear polarizer 60 in this embodiment are consistent with working principles in the first embodiment, and are not repeated here.

The present application introduces the phase-compensated liquid crystal layer 50 of $1/4\lambda$ on the organic light-emitting device layer 30 to replace a traditional $1/4\lambda$ phase difference compensation film, thereby reducing costs by 80%, and overcoming a problem of visual interference and glare effects brought about by the display panel due to external light.

The present application further provides a method of manufacturing the OLED display panel as described above. As shown in FIG. 5, the method includes steps as follows:

S1: providing a display substrate to be prepared with a phase-compensated liquid crystal layer, and forming an alignment groove on a surface of the display substrate by performing linearly polarizing ultraviolet light irradiation on the surface of the display substrate.

The phase-compensated liquid crystal layer is prepared in a thin-film encapsulation layer and is taken as an example, and a manufacturing process is described in detail in the following. The phase-compensated liquid crystal layer functions to replace a circular polarizer in a polarizing structure, and other structural functions of the thin-film encapsulation layer remain unchanged, wherein the thin-film encapsulation layer is mainly provided to prevent moisture and oxygen from intruding. Please refer to FIGS. 6A-6D in combination, specific steps to be implemented are as follows:

S10: the first inorganic layer 401 is prepared with a thickness of about 1 to 2 microns ($\mu m$) on the display substrate 10 by a chemical vapor deposition (CVD) process.

S11: performing linearly polarizing ultraviolet light irradiation on the first inorganic layer 401 using a mask 100. An irradiation angle with respect to the display substrate 10 is preferably 60°, and an irradiation intensity is preferably 15 Joules (J)/cm2. This process is aimed to form the alignment groove on the surface of the first inorganic layer 401, so that all the liquid crystal molecules are arranged in a direction intersecting an axial direction of the linear polarizer at a certain angle, thereby to achieve a same polarization direction for all photons when passing through the liquid crystal molecules.

S2: preparing a liquid crystal material on the surface of the display substrate 10, wherein liquid crystal molecules in the liquid crystal material are twisted at predetermined angles and neatly arranged with respect to the alignment groove, and forming the phase-compensated liquid crystal layer 50 by curing the liquid crystal material.

A method of preparing the liquid crystal material includes an inkjet printing method, a blade coating method, a spin coating method, and the like. Then, an organic layer 402 is formed on the phase-compensated liquid crystal layer 50 by an inkjet printing method, and a second inorganic layer 401 is further formed on the organic layer 402.

S3: laminating a linear polarizer 60 to enable generation of polarized light such that after external light passes through the linear polarizer and the phase-compensated liquid crystal layer, the external light is reflected to go through again the phase-compensated liquid crystal layer in a direction perpendicular to a polarization direction of the linear polarizer.

The present application introduces the 1/4λ phase-compensated liquid crystal layer 50 to replace a traditional 1/4λ phase difference compensation film, thereby overcoming a problem of visual interference and glare effects brought about by the display panel due to external light.

Accordingly, although the present invention has been disclosed as a preferred embodiment, it is not intended to limit the present invention. Those skilled in the art without departing from the spirit and scope of the present invention may make various changes or modifications, and thus the scope of the present invention should be after the appended claims and their equivalents.

What is claimed is:

1. An organic light-emitting diode (OLED) display panel, comprising:
    a substrate;
    an array layer disposed on a surface of the substrate;
    an organic light-emitting device layer disposed on a surface of the array layer;
    a thin-film encapsulation layer disposed on the organic light-emitting device layer; and
    a linear polarizer and a phase-compensated liquid crystal layer, wherein the linear polarizer is disposed on a side of the organic light-emitting device layer away from the substrate, and the phase-compensated liquid crystal layer is disposed between the organic light-emitting device layer and the linear polarizer;
    wherein polarized light is generated after external light passes through the linear polarizer and the phase-compensated liquid crystal layer to be reflected to go through again the phase-compensated liquid crystal layer in a direction perpendicular to a polarization direction of the linear polarizer,
    wherein the thin-film encapsulation layer at least comprises a three-layered structure including a plurality of inorganic layers and at least an organic layer disposed in a stack arrangement, and wherein the phase-compensated liquid crystal layer is disposed between any adjacent two of the inorganic layers and the organic layer.

2. The OLED display panel of claim 1, wherein the phase-compensated liquid crystal layer is disposed between the organic light-emitting device layer and the thin-film encapsulation layer.

3. The OLED display panel of claim 1, wherein the phase-compensated liquid crystal layer is disposed between the thin-film encapsulation layer and the linear polarizer.

4. The OLED display panel of claim 2, wherein the linear polarizer is disposed on a surface of the phase-compensated liquid crystal layer.

5. The OLED display panel of claim 2, wherein the linear polarizer is spaced apart from the phase-compensated liquid crystal layer with respect to the inorganic layers and/or the organic layer.

6. The OLED display panel of claim 2, wherein an alignment groove for aligning liquid crystal molecules is provided on a surface of the organic light-emitting device layer or a surface of one of the inorganic layers or the organic layer in contact with the phase-compensated liquid crystal layer.

7. The OLED display panel of claim 6, wherein the phase-compensated liquid crystal layer comprises liquid crystal molecules neatly arranged and aligned in twist directions at predetermined angles so that linearly polarized light is generated after the external light passes through the linear polarizer, wherein the linearly polarized light passes through the phase-compensated liquid crystal layer to form circularly polarized light.

8. The OLED display panel of claim 1, wherein the phase-compensated liquid crystal layer is configured to compensate a phase difference of a quarter wavelength.

9. An organic light-emitting diode (OLED) display panel, comprising:
    a substrate;
    an array layer disposed on a surface of the substrate;
    an organic light-emitting device layer disposed on a surface of the array layer;
    a thin-film encapsulation layer disposed on the organic light-emitting device layer; and
    a linear polarizer and a phase-compensated liquid crystal layer, wherein the linear polarizer is disposed on a side of the organic light-emitting device layer away from the substrate, and the phase-compensated liquid crystal layer is disposed between the organic light-emitting device layer and the linear polarizer,
    wherein polarized light is generated after external light passes through the linear polarizer and the phase-compensated liquid crystal layer to be reflected to go through again the phase-compensated liquid crystal layer in a direction perpendicular to a polarization direction of the linear polarizer, and
    wherein the phase-compensated liquid crystal layer is further disposed between the organic light-emitting device layer and the thin-film encapsulation layer, and the linear polarizer is spaced apart from the phase-compensated liquid crystal layer with respect to the inorganic layers and/or the organic layer.

10. The OLED display panel of claim 9, wherein the phase-compensated liquid crystal layer is disposed between the thin-film encapsulation layer and the linear polarizer.

11. The OLED display panel of claim 9, wherein the phase-compensated liquid crystal layer is configured to compensate a phase difference of a quarter wavelength.

12. An organic light-emitting diode (OLED) display panel, comprising:
    a substrate;
    an array layer disposed on a surface of the substrate;
    an organic light-emitting device layer disposed on a surface of the array layer;
    a thin-film encapsulation layer disposed on the organic light-emitting device layer; and a linear polarizer and a phase-compensated liquid crystal layer, wherein the linear polarizer is disposed on a side of the organic light-emitting device layer away from the substrate, and the phase-compensated liquid crystal layer is disposed between the organic light-emitting device layer and the linear polarizer, wherein polarized light is generated after external light passes through the linear polarizer and the phase-compensated liquid crystal layer to be reflected to go through again the phase-compensated liquid crystal layer in a direction perpendicular to a polarization direction of the linear polarizer, and wherein the phase-compensated liquid crystal layer is further disposed between the organic light-emitting device layer and the thin-film encapsulation layer, and an alignment groove for aligning liquid crystal molecules is provided on a surface of the organic light-emitting device layer or a surface of one of the inorganic layers or the organic layer in contact with the phase-compensated liquid crystal layer.

13. The OLED display panel of claim 12, wherein the phase-compensated liquid crystal layer is disposed between the thin-film encapsulation layer and the linear polarizer.

14. The OLED display panel of claim 12, wherein the phase-compensated liquid crystal layer is configured to compensate a phase difference of a quarter wavelength.

* * * * *